US010536032B2

(12) United States Patent
Hayes et al.

(10) Patent No.: US 10,536,032 B2
(45) Date of Patent: Jan. 14, 2020

(54) SYSTEMS AND METHOD FOR CONTROLLING A TRANSFER SWITCH

(71) Applicant: ASCO Power Technologies L.P., Florham Park, NJ (US)

(72) Inventors: John Hayes, Hardwick, NJ (US); Daniel G. Scheffer, Boonton, NJ (US)

(73) Assignee: ASCO Power Technologies L.P., Florham, NJ (US)

( * ) Notice: Subject to any disclaimer, the term of this patent is extended or adjusted under 35 U.S.C. 154(b) by 148 days.

(21) Appl. No.: 15/902,863

(22) Filed: Feb. 22, 2018

(65) Prior Publication Data

US 2019/0260229 A1 Aug. 22, 2019

(51) Int. Cl.
*H02J 9/06* (2006.01)
*G01R 19/25* (2006.01)
*H02J 3/14* (2006.01)

(52) U.S. Cl.
CPC .............. *H02J 9/066* (2013.01); *G01R 19/25* (2013.01); *H02J 3/14* (2013.01); *H02J 2009/068* (2013.01)

(58) Field of Classification Search
CPC ...... H02J 3/14; H02J 9/06; H02J 9/066; H02J 2009/068; G01R 19/25
USPC ............................................. 307/23, 64, 66
See application file for complete search history.

(56) References Cited

U.S. PATENT DOCUMENTS 6,538,345 B1 * 3/2003 Maller .................... H02J 9/061 307/64

* cited by examiner

*Primary Examiner* — Hal Kaplan
(74) *Attorney, Agent, or Firm* — Locke Lord LLP

(57) ABSTRACT

An example system for controlling a transfer switch includes a power modulation circuit and a control module. When the power modulation circuit is coupled to a solenoid of a transfer switch, a first power supply, and a second power supply, the control module is configured to perform functions. The functions include sensing one or more operating conditions of the system and using the one or more operating conditions of the system as a basis to determine one or more control parameters. The functions also include controlling, according to the one or more control parameters, the power modulation circuit to cause the second power supply to provide a current through the solenoid, thereby operating the transfer switch to discontinue a conductive path between a load and the first power supply and create a conductive path between the load and the second power supply.

20 Claims, 4 Drawing Sheets

123
121
110
112
104
119
118
C
110
112
120
122
106
B
125
126
124
102
E
108
110
114
112
127
128
100
116

SYSTEMS AND METHOD FOR CONTROLLING A TRANSFER SWITCH

FIELD

The present disclosure generally relates to systems and methods for controlling transfer switches, and more specifically to controlling transfer switches based on operating conditions of the system.

BACKGROUND

Electro-mechanical transfer switches are electrically operated and mechanically held double throw switches used to transfer an electrical load between two power sources. For example, a transfer switch might be used to transfer a load from a "normal" power source such as standard 120 volt or 240 volt AC service, to an "auxiliary" power source such as a generator. The transfer can occur in response to detecting a malfunction of the normal power source or because the normal power source is being serviced, for example. These transfer switches generally include a switching mechanism that is magnetically coupled to a solenoid. When a control current is provided to the solenoid, the switching mechanism toggles its position to transfer the load from the normal power source to the auxiliary power source.

Often, the solenoid will be operated via a normally open switch connection to the normal power source and/or to the auxiliary power source, depending on the situation. Typically, both types of power sources will produce waveforms that exhibit non-idealities such as amplitude variation or frequency variation. Changes in the voltage amplitude across the solenoid or the current amplitude through the solenoid cause undesirable changes in the time it takes for the transfer switch to transfer the load between power sources. For example, the transfer time generally increases in response to a decrease in solenoid current or voltage amplitude. Changes in ambient temperature can also cause the transfer time to vary undesirably. For example, an increase in ambient temperature will generally cause reduced current through the solenoid, and thus, an increased transfer time.

SUMMARY

A first aspect of the disclosure is a system for controlling a transfer switch. The system includes a power modulation circuit and a control module. When the power modulation circuit is coupled to a solenoid of a transfer switch, a first power supply, and a second power supply, the control module is configured to perform functions. The functions include sensing one or more operating conditions of the system and using the one or more operating conditions of the system as a basis to determine one or more control parameters. The functions also include controlling, according to the one or more control parameters, the power modulation circuit to cause the second power supply to provide a current through the solenoid, thereby operating the transfer switch to discontinue a conductive path between a load and the first power supply and create a conductive path between the load and the second power supply.

A second aspect of the disclosure is a method for controlling a transfer switch. The method includes sensing one or more operating conditions of a system that includes a power modulation circuit and a control module. The power modulation circuit is coupled to (1) a solenoid of a transfer switch, (2) a first power supply, and (3) a second power supply. The method further includes using the one or more operating conditions of the system as a basis to determine one or more control parameters. The method further includes controlling, according to the one or more control parameters, the power modulation circuit to cause the second power supply to provide a current through the solenoid, thereby operating the transfer switch to discontinue a conductive path between a load and the first power supply and create a conductive path between the load and the second power supply.

A third aspect of the disclosure is a system for controlling a transfer switch. The system includes a control module and a power modulation circuit. The power modulation circuit includes a switch assembly having a first state and a second state. In the first state the switch assembly is configured to provide a conductive path between a first power supply and the power modulation circuit, and in the second state the switch assembly is configured to provide a conductive path between a second power supply and the power modulation circuit. The power modulation circuit also includes a switch configured to perform functions. The functions include receiving a control signal from the control module and using the control signal as a basis to either create or discontinue a conductive path between (a) a solenoid of a transfer switch and (b) the first power supply or the second power supply. The power modulation circuit also incudes a rectifier configured to perform functions. The functions include rectifying alternating current received from the first power supply or the second power supply and providing the rectified current to the solenoid. The control module is also configured to perform functions. The functions include sensing one or more operating conditions of the system including one or more of a temperature associated with the system, a voltage or current amplitude of the first power supply, a voltage or current phase of the first power supply, a voltage or current amplitude of the second power supply, a voltage or current phase of the second power supply, or an amplitude of current passing through the solenoid. The functions also include using the one or more operating conditions of the system as a basis to determine a duty cycle. The functions also include providing a control signal having the duty cycle to the power modulation circuit to cause the second power supply to provide a current through the solenoid, thereby operating the transfer switch to discontinue a conductive path between a load and the first power supply and create a conductive path between the load and the second power supply.

The features, functions, and advantages that have been discussed can be achieved independently in various embodiments or may be combined in yet other embodiments further details of which can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and descriptions thereof, will best be understood by reference to the following detailed description of an illustrative embodiment of the present disclosure when read in conjunction with the accompanying Figures.

DETAILED DESCRIPTION

Figure 1:
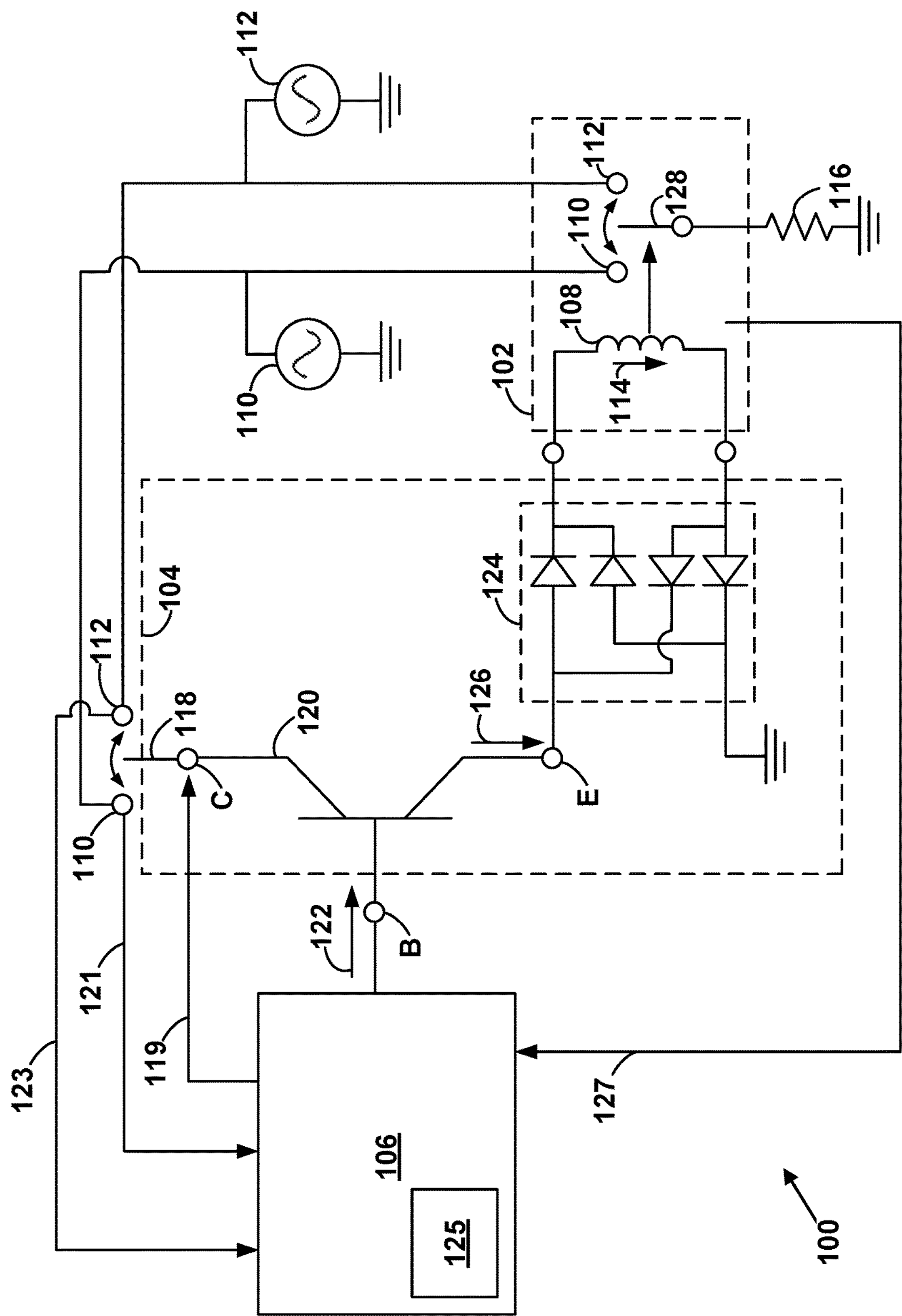
FIG. 1 is a schematic diagram of a system for controlling a transfer switch, according to an embodiment of the disclosure.

As discussed above, current systems and methods for operating a transfer switch typically exhibit undesirable uncertainty with regard to the amount of time it takes for the transfer switch to transfer a load between power sources. The systems and methods disclosed herein may be helpful in alleviating this and other uncertainties.

Within examples, a system for controlling a transfer switch includes a power modulation circuit and a control module. The control module is configured to perform functions when the power modulation circuit is coupled to a solenoid of a transfer switch, a first power supply (e.g., 120 volt or 240 volt AC service), and a second power supply (e.g., a generator). The functions include sensing one or more operating conditions of the system. The functions also include using the one or more operating conditions of the system as a basis to determine one or more control parameters. The functions also include controlling, according to the one or more control parameters, the power modulation circuit to cause the second power supply to provide a current through the solenoid, thereby operating the transfer switch to discontinue a conductive path between a load and the first power supply and create a conductive path between the load and the second power supply.

For example, there may be a positive correlation between the transfer time of the transfer switch and a temperature associated with the system. Also, there may be a negative correlation between a voltage amplitude of the power supply that is used to power the solenoid and the transfer time of the transfer switch. As such, if the anticipated transfer time based on the current operating conditions is longer than desired, the control module can increase the duty cycle of a (e.g., square wave) control signal that the control module provides to the power modulation circuit. This generally results in the power modulation circuit providing to the solenoid, via pulse-width modulation, a current from the power supply with an increased duty cycle. The effect is that the transfer time will be decreased. Similarly, if the anticipated transfer time based on the current operating conditions is shorter than desired, the control module can decrease the duty cycle of the control signal that the control module provides to the power modulation circuit. This generally results in the power modulation circuit providing a current with a decreased duty cycle to the solenoid, the effect being that the transfer time will be increased.

Additionally, the control module can monitor the voltage or current waveform of the power supply that the power modulation circuit is connected to, and use its periodicity to predict when the waveform will exhibit an instantaneous voltage of zero volts (e.g., a zero crossing). It may be desirable for the control module to cause the power modulation circuit to connect the power supply to the solenoid of the transfer switch at the time at which the waveform of the power supply exhibits an instantaneous voltage of zero volts. By controlling both the effective voltage provided to the solenoid and the timing by which the solenoid is operated, the transfer switch can be operated in a predictable and repeatable manner. In a similar manner, the solenoid can be disconnected from the power supply at a time at which the power supply waveform is at a peak.

Furthermore, to prevent damage to the solenoid, the control module can monitor the voltage of the power supply connected to the power modulation circuit and refrain from operating the transfer switch if the voltage of the power supply is below a minimum voltage. Additionally, the control module can monitor whether the transfer switch successfully performed the transfer, so that the transfer can be reattempted in the event of failure.

Disclosed embodiments will now be described more fully hereinafter with reference to the accompanying Drawings, in which some, but not all of the disclosed embodiments are shown. Indeed, several different embodiments may be described and should not be construed as limited to the embodiments set forth herein. Rather, these embodiments are described so that this disclosure will be thorough and complete and will fully convey the scope of the disclosure to those skilled in the art.

FIG. 1 is a schematic diagram of a system 100 for controlling a transfer switch 102. The system 100 includes a power modulation circuit 104 and a control module 106. The control module 106 is configured to perform functions when the power modulation circuit 104 is coupled to a solenoid 108 of the transfer switch 102, a first power supply 110 ("normal"), and a second power supply 112 ("auxiliary"). The functions include sensing one or more operating conditions of the system 100 and using the one or more operating conditions of the system 100 as a basis to determine one or more control parameters. The functions also include controlling, according to the one or more control parameters, the power modulation circuit 104 to cause the second power supply 112 to provide a current 114 through the solenoid 108, thereby operating the transfer switch 102 to discontinue a conductive path between a load 116 and the first power supply 110 and create a conductive path between the load 116 and the second power supply 112.

The transfer switch 102 includes the solenoid 108 and a switching mechanism 128. The solenoid 108 generally takes the form of a cylindrically coiled wire that is magnetically coupled to the switching mechanism 128 and that, when energized via the current 114, is configured to operate the switching mechanism 128 such that the switching mechanism 128 discontinues a conductive path between the load 116 and the first power supply 110, and creates a conductive path between the load 116 and the second power supply 112, or vice versa.

The power modulation circuit 104 includes a switch assembly 118, a switch 120, and a rectifier 124. The switch assembly 118 has a first state and a second state. In the first state, the switch assembly 118 is configured to provide a conductive path between the first power supply 110 and the power modulation circuit 104. In the second state, the switch assembly 118 is configured to provide a conductive path between the second power supply 112 and the power modulation circuit 104. The control module 106 controls the switch assembly 118 via a wired or wireless connection 119, as described below. Depending on whether the switch assembly 118 is in the first state or in the second state, the switch assembly 118 provides a conductive path between switch 120 and either the first power supply 110 or the second power supply 112.

As shown in FIG. 1, the switch 120 takes the form of a bipolar junction transistor, but in other examples the switch 120 could take the form of a MOSFET or another 3-terminal switching device. The switch 120 is configured to receive a control signal 122 from the control module 106 and use the control signal 122 as a basis to either create or discontinue a conductive path between the (a) solenoid 108 and (b) the first power supply 110 or the second power supply 112, depending on the state of the switch assembly 118. For example, the switch 120 is generally "turned on" when the control signal 122 is a digital voltage "high" signal. In this state, the switch 120, via the rectifier 124, provides a conductive path between the solenoid 108 and either the first power supply 110 or the second power supply 112, depending on the state of the switch assembly 118. The switch 120 is generally "turned off" when the control signal 122 is a digital voltage "low" signal. In this state, the switch 120 isolates the solenoid 108 from the switch assembly 118. In other examples, the switch 120 could take another form in which a digital voltage "low" control signal 122 closes the switch 120 and a digital voltage "high" control signal 122 opens the switch 120.

As shown in FIG. 1, the rectifier 124 includes four interconnected diodes configured to perform full-wave rectification upon the current 126 (e.g., alternating current) and provide the rectified current 114 to the solenoid 108. The rectifier may take other forms that are known to perform full-wave rectification as well.

The control module 106 may be implemented via any combination of hardware and/or software to implement the functionality described herein. For example, the control module 106 can include one or more processors (e.g., general purpose processors, digital signal processors, special purpose processors) and a memory (e.g., volatile, nonvolatile, removable, non-removable, magnetic, optical, or flash storage) storing instructions that, when executed by the one or more processors, cause the control module 106 or the system 100 to perform any of the functions described herein. In another example, the control module 106 may include special purpose hardware that is hard-wired to perform the functions described herein. Other examples are possible.

The control module 106 is configured to perform several sensing and control operations for the system 100. For example, the control module 106 is configured to the control the switch 120 via pulse-width modulation by providing the control signal 122 at the base terminal "B" of the switch 120. As shown in FIG. 1, the collector terminal "C" of the switch 120 can be connected to either the first power supply 110 or the second power supply 112 via the switch assembly 118. By controlling the switch 120, the control module 106 can cause the switch 120 to provide to the rectifier 124 via the emitter terminal "E" what amounts to a controllable percentage of the voltage provided by either the first power supply 110 or the second power supply 112, depending on the state of the switch assembly 118. For example, by controlling the control signal 122 to have a duty cycle of 50%, the control module 106 causes the switch 120 to provide the voltage of either the first power supply 110 or the second power supply 112 modulated at a duty cycle of 50% (e.g., by having the switch 120 open and close according to a 50% duty cycle). This causes the emitter terminal "E" of the switch that is connected to the rectifier 124 to exhibit a time-averaged voltage that is about 50% of the voltage generated by the power supply. The control module 106 can adjust the control signal 122 to have a 30% duty cycle, resulting in a time-averaged voltage at terminal "E" of about 30% of the voltage generated by the power supply, and so forth.

The control module 106 is configured to control the switch assembly 118 via the wired or wireless connection 119. If the load 116 is drawing current from the first power supply 110, the switch assembly 118 will generally be in the second state in which the switch assembly 118 provides a conductive path between the switch 120 and the second power supply 112. Conversely, if the load 116 is drawing current from the second power supply 112, the switch assembly 118 will generally be in the first state in which the switch assembly 118 provides a conductive path between the switch 120 and the first power supply 110. The control module 106 will generally cause the switch assembly 118 to toggle states after operation of the transfer switch 102, so that the switch assembly 118 is ready to provide current to the solenoid 108 from the power supply that is presumably functioning normally.

Additionally, the control module 106 is configured to sense the voltage or current amplitude, the instantaneous voltage or current, the time-averaged voltage or current, and the voltage or current waveform (e.g., with respect to time) of the first power supply 110 via the connection 121. The control module 106 is also configured to sense the voltage or current amplitude, the instantaneous voltage or current, the time-averaged voltage or current, and the voltage or current waveform of the second power supply 112 via the connection 123. The control module 106 may perform these measurements via onboard or external circuitry, for example. Furthermore, the control module 106 may have an internal or external temperature sensor 125 that is configured to monitor the ambient temperature near the solenoid 108.

Figure 2:
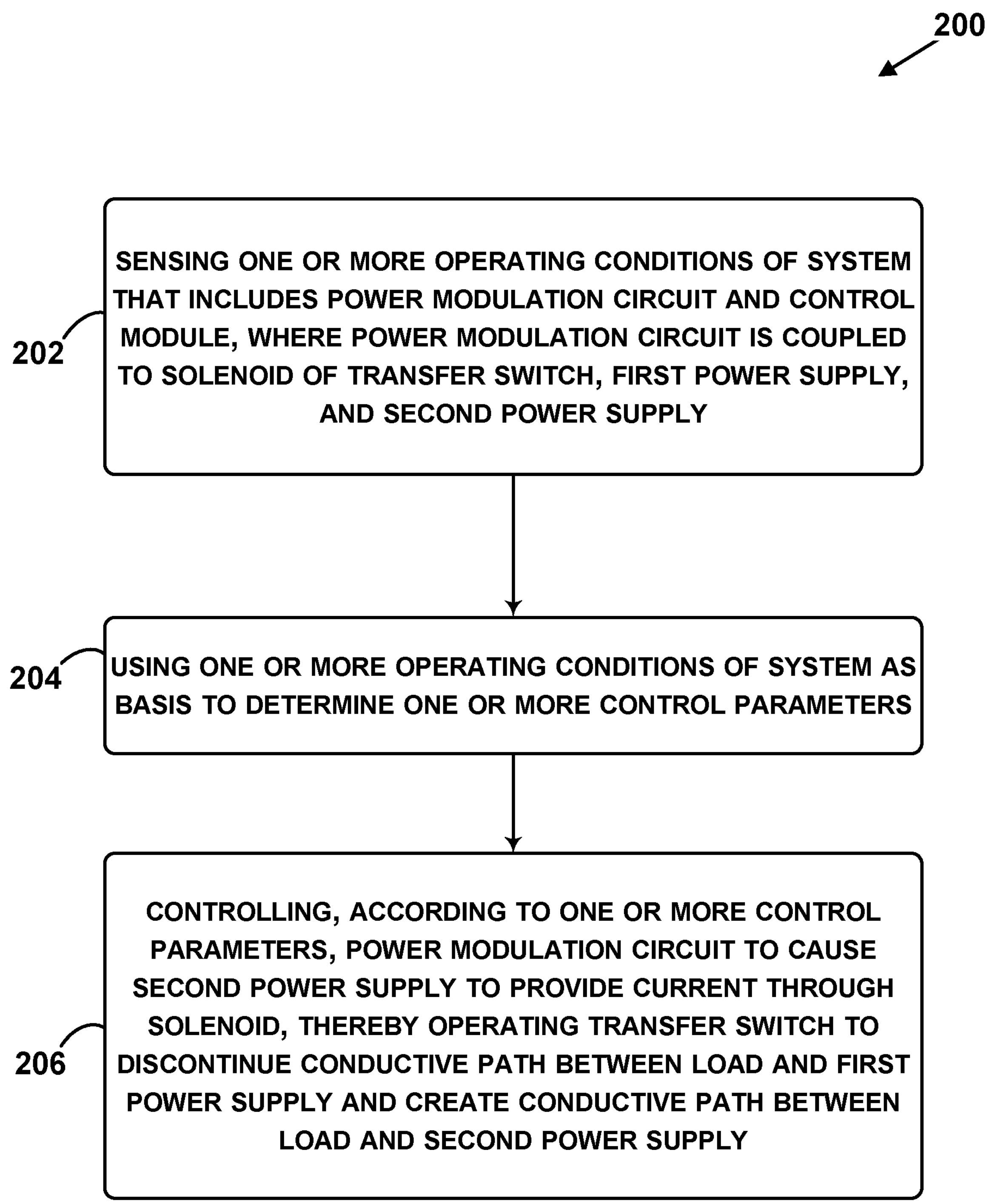
FIG. 2 is a block diagram of a method for controlling a transfer switch, according to an embodiment of the disclosure.

FIG. 2 is a block diagram of a method 200 for controlling a transfer switch. The method 200 could be performed by the system 100 to control the transfer switch 102, for example.

At block 202, the method 200 includes sensing one or more operating conditions of a system that includes a power modulation circuit and a control module. In this context, the power modulation circuit is coupled to a solenoid of a transfer switch, a first power supply, and a second power supply.

As shown in FIG. 1, the power modulation circuit 104 is coupled to the solenoid 108 of the transfer switch 102, the first power supply 110, and the second power supply 112. The control module 106 may sense one or more operating conditions of the system 100 such as a temperature associated with the system 100, a voltage or current amplitude of the first power supply 110, a voltage or current phase of the first power supply 110, a voltage or current amplitude of the second power supply 112, a voltage or current phase of the second power supply 112, or an amplitude (e.g., magnitude) of the current 114 passing through the solenoid 108.

For example, the control module 106 may sense, via the temperature sensor 125, a temperature in the vicinity of the solenoid 108, or a temperature in the general vicinity of the transfer switch 102 or the system 100.

Additionally, the control module 106 can sense, via the connection 121, the voltage or current amplitude of the first power supply 110. The first power supply 110 will generally be of interest when the first power supply 110 is to be used to power the next operation of the transfer switch 102 (e.g., when the load 116 is drawing current from the second power supply 112). For instance, the control module 106 can monitor one or more periods of the voltage waveform of the first power supply 110, determine the minimum and maximum instantaneous voltages of the waveform over that time period, and determine that the voltage amplitude of the first power supply 110 is equal to a difference between an average of one or more of the maximum instantaneous voltages and an average of one or more of the minimum instantaneous voltages of the first power supply 110. Other examples are possible.

Furthermore, the control module 106 can sense, via the connection 121, the voltage or current phase of the first power supply 110. For instance, the control module 106 can monitor one or more periods of the voltage waveform of the first power supply 110, take note of the phase of the waveform with respect to time, and use that information to predict when the waveform will exhibit a particular phase again. For example, the control module 106 may sense that the voltage waveform of the first power supply 110 reaches a rising zero crossing at times t=n*0.1666 seconds (e.g., for a 60 Hz waveform) where 'n' is an integer.

Additionally, the control module 106 can sense, via the connection 123, the voltage or current amplitude of the second power supply 112. The second power supply 112 will generally be of interest when the second power supply 112 is to be used to power the next operation of the transfer switch 102 (e.g., when the load 116 is drawing current from the first power supply 110). For instance, the control module 106 can monitor one or more periods of the voltage waveform of the second power supply 112, determine the minimum and maximum instantaneous voltages of the waveform over that time period, and determine that the voltage amplitude of the second power supply 112 is equal to a difference between an average of one or more of the maximum instantaneous voltages and an average of one or more of the minimum instantaneous voltages of the second power supply 112. Other examples are possible.

Furthermore, the control module 106 can sense, via the connection 123, the voltage or current phase of the second power supply 112. For instance, the control module 106 can monitor one or more periods of the voltage waveform of the second power supply 112, take note of the phase of the waveform with respect to time, and use that information to predict when the waveform will exhibit a particular phase again. For example, the control module 106 may sense that the voltage waveform of the second power supply 112 reaches a rising zero crossing at times t=(n*0.1666)+0.05 seconds (e.g., for a 60 Hz waveform).

At block 204, the method 200 includes using the one or more operating conditions of the system (e.g., the system 100) as a basis to determine one or more control parameters. For example, the one or more control parameters might take the form of a duty cycle of a control signal. By further example, controlling the power modulation circuit 104 can include the control module 106 providing the control signal 122 having the determined duty cycle to the power modulation circuit 104.

One way for determining the duty cycle for the control signal 122 is by using a mathematical function that maps various combinations of (a) temperatures associated with the system 100 and voltage (or current) amplitudes of the second power supply 112 (or the first power supply 110) to (b) duty cycles of the control signal 122. The function may be determined experimentally via regression analysis, for example. In other embodiments, the function can be determined via circuit simulation techniques. In other examples, the control module 106 may use a look up table. When the duty cycle that "matches" the detected temperature of the system 100 and/or the amplitude of the second power supply 112 (or the first power supply 110) is provided to the power modulation circuit 104, the power modulation circuit 104 may provide a pulse-width modulated current 114 to the solenoid 108 such that the transfer switch 102 exhibits the desired transfer time. A duty cycle of 50% can be selected as a "base" duty cycle for the control signal 122 so that the full range of potential duty cycles (0-100%) can be used to compensate for changes in operating conditions that tend to undesirably increase or decrease the transfer time of the transfer switch 102.

Another way for determining the duty cycle of the control signal 122 is by the control module 106 detecting, via the wired or wireless connection 127, the magnitude (e.g., amplitude) of the current 114 of the solenoid 108 during an operation of the transfer switch 102, and adjusting the duty cycle of the control signal 122 for an upcoming operation of the transfer switch 102 based on the detected magnitude of the current 114. More specifically, the control module 106 might increase the duty cycle of the control signal 122 in response to determining that the magnitude of the current 114 was lower than expected. The degree of increase of the duty cycle of the control signal 122 might correlate positively with the amount the expected value of the current 114 exceeded the actual value of the current 114. Similarly, the control module 106 might decrease the duty cycle of the control signal 122 in response to determining that the magnitude of the current 114 was higher than expected. The degree of decrease of the duty cycle of the control signal 122 might correlate positively with the amount the actual value of the current 114 exceeded the expected value of the current 114.

The control module 106 can also determine timing parameters for the control signal 122. For example, it may be desirable for the control module 106 to begin providing the control signal 122 when the instantaneous voltage of the first power supply 110 (or the second power supply 112) reaches a rising zero crossing. By beginning to provide the control signal 122 at this time, the current 114 will generally also take the form of a pulse-width modulated current that begins with a rising zero crossing, which may be beneficial. In other examples, the control module 106 can determine timing parameters that cause operation of the transfer switch 102 to begin at other phases of the waveform of the first power supply 110 or the second power supply 112.

At block 206, the method 200 includes controlling, according to the one or more control parameters, the power modulation circuit to cause the second power supply to provide a current through the solenoid, thereby operating the transfer switch to discontinue a conductive path between a load and the first power supply and create a conductive path between the load and the second power supply.

For instance, the control module 106 can control the power modulation circuit 104 by providing the control signal 122 according to the determined one or more control parameters (e.g., duty cycle, timing, etc.). In situations where the load 116 is drawing current from the first power supply 110, this will generally result in the second power supply 112 providing the current 114 through the solenoid 108 such that the transfer switch 102 (e.g., the switching mechanism 128) discontinues a conductive path between the load 116 and the first power supply 110, and creates a conductive path between the load 116 and the second power supply 112. In situations where the load 116 is drawing current from the second power supply 112, this will generally result in the first power supply 110 providing the current 114 through the solenoid 108 such that the transfer switch 102 (e.g., the switching mechanism 128) discontinues a conductive path between the load 116 and the second power supply 112, and creates a conductive path between the load 116 and the first power supply 110.

As such, the power modulation circuit 104 can use the control signal 122 as a basis to either create or discontinue a conductive path between (a) the solenoid 108 and (b) the first power supply 110 or the second power supply 112. That is, depending on the state of the switch assembly 118, the control signal 122 can periodically open and close the switch 120 to periodically create or discontinue a conductive path between (a) the solenoid 108 and (b) the first power supply 110 or the second power supply 112. The fluctuation of the control signal 122 between digital high and low voltages may cause the periodic operation of the switch 120.

As shown in FIG. 1, a (e.g., full wave) pulse-width modulated alternating current 126 may be an output of the switch 120 at the terminal "E." The rectifier 124 may perform (e.g., full wave) rectification upon the current 126 to generate the current 114 that flows through the solenoid 108. The current 126 is received by the rectifier 124 from either the first power supply 110 or the second power supply 112, via the switch 120.

Figure 3:
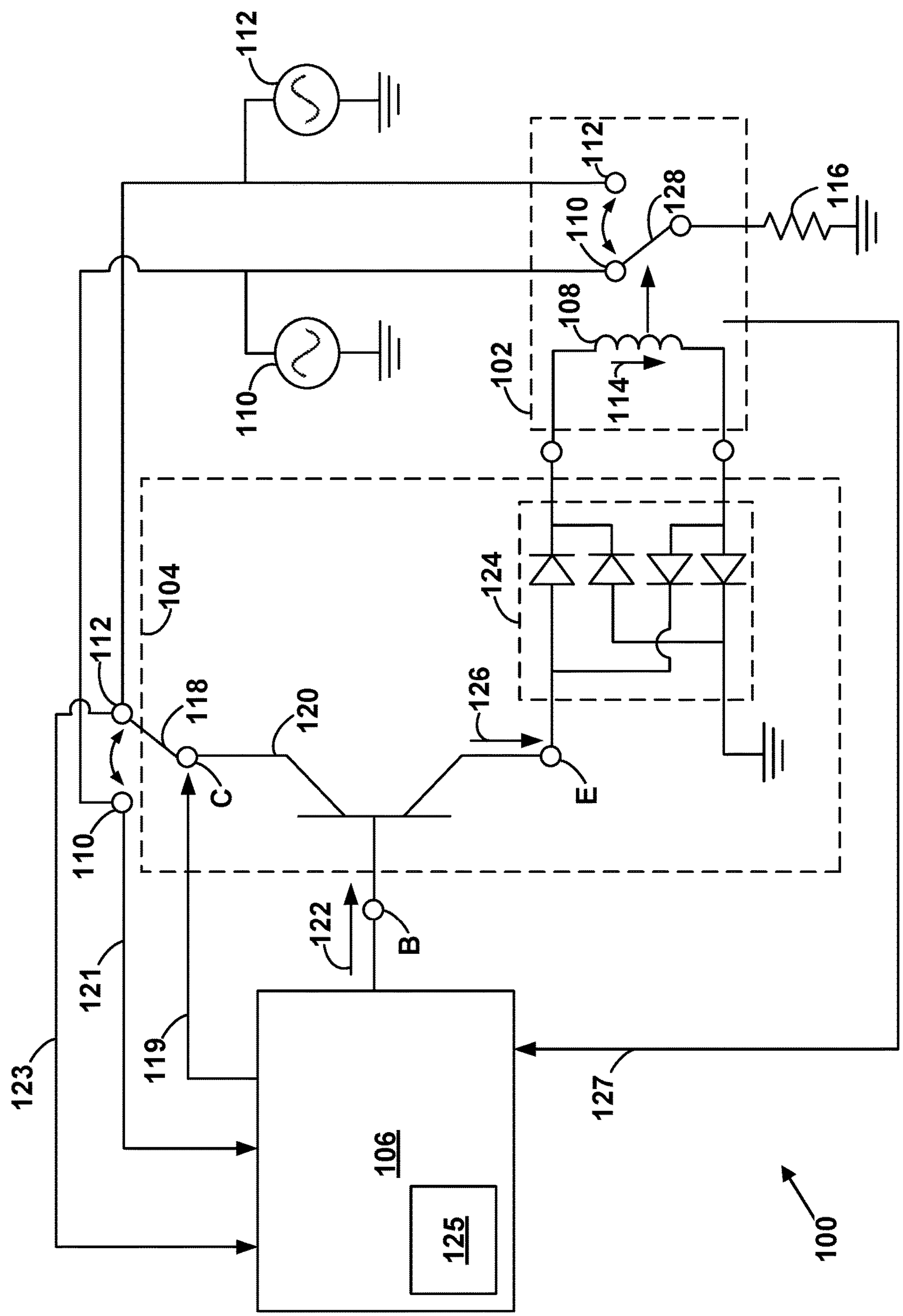
FIG. 3 is a schematic diagram of a system for controlling a transfer switch, according to an embodiment of the disclosure.

If the switch assembly 118 is connecting the second power supply 112 to the switch 120 and the load 116 is drawing current from the first power supply 110 (as shown in FIG. 3), the control module 106 will generally control the power modulation circuit 104 such that a duration at least as long as a period of oscillation of the second power supply 112 elapses between (a) the transfer switch 102 discontinuing the conductive path between the load 116 and the first power supply 110 and (b) creating the conductive path between the load 116 and the second power supply 112.

Figure 4:
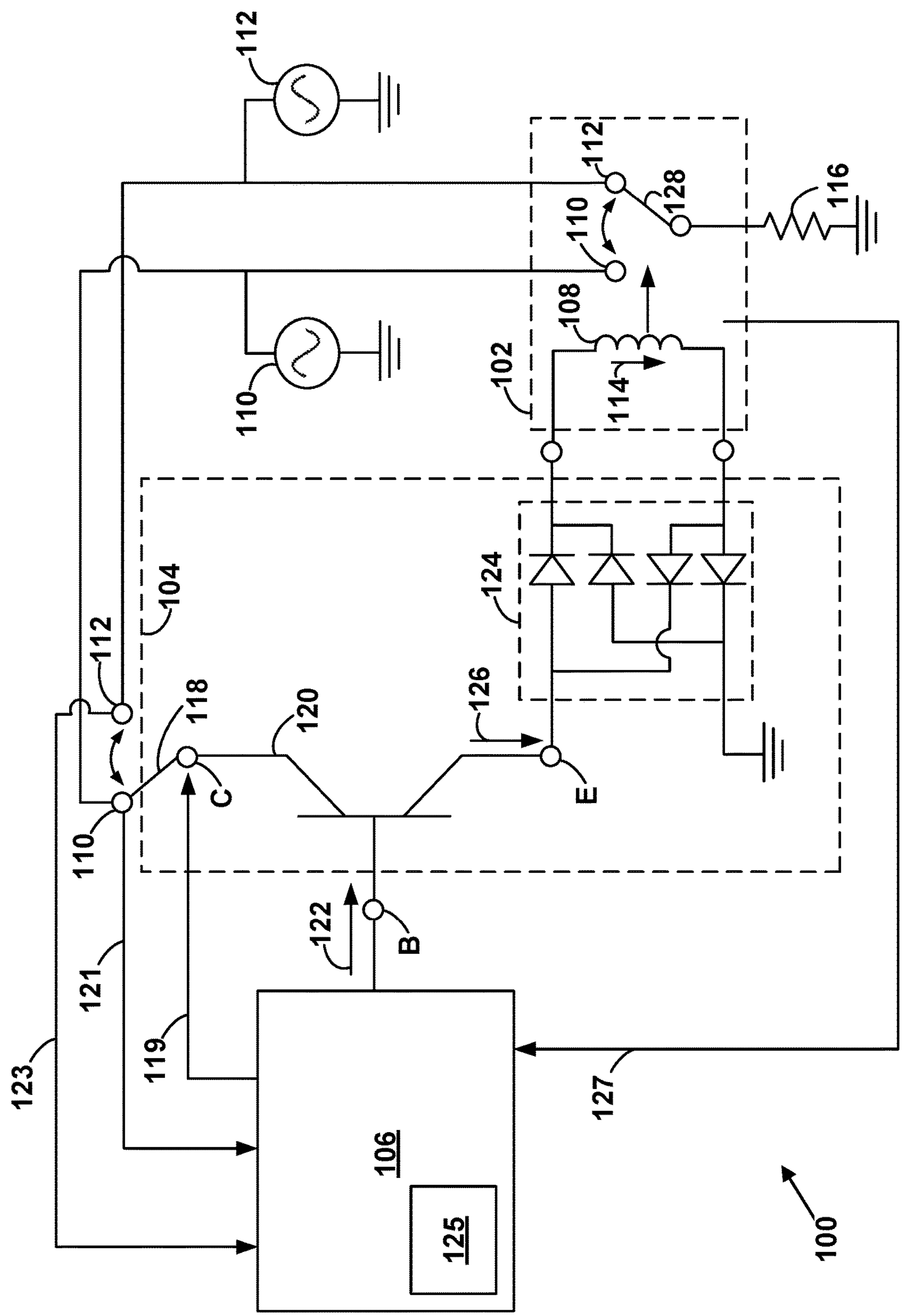
FIG. 4 is a schematic diagram of a system for controlling a transfer switch, according to an embodiment of the disclosure.

If the switch assembly 118 is connecting the first power supply 110 to the switch 120 and the load 116 is drawing current from the second power supply 112 (as shown in FIG. 4), the control module 106 will generally control the power modulation circuit 104 such that a duration at least as long as a period of oscillation of the first power supply 110 elapses between (a) the transfer switch 102 discontinuing the conductive path between the load 116 and the second power supply 112 and (b) creating the conductive path between the load 116 and the first power supply 110.

If the switch assembly 118 is connecting the second power supply 112 to the switch 120 and the load 116 is drawing current from the first power supply 110 (as shown in FIG. 3), the control module 106 may control the power modulation circuit 104 to cause the second power supply 112 to begin providing the current 114 through the solenoid 108 when a voltage phase of the second power supply 112 is within a predetermined range of phase. As discussed above, the control module 106 may control the power modulation circuit 104 to cause the second power supply 112 to begin providing the current 114 through the solenoid 108 when the second power supply 112 is expected to exhibit a rising zero crossing, for example.

If the switch assembly 118 is connecting the first power supply 110 to the switch 120 and the load 116 is drawing current from the second power supply 112 (as shown in FIG. 4), the control module 106 may control the power modulation circuit 104 to cause the first power supply 110 to begin providing the current 114 through the solenoid 108 when a voltage phase of the first power supply 110 is within a predetermined range of phase. As discussed above, the control module 106 may control the power modulation circuit 104 to cause the first power supply 110 to begin providing the current 114 through the solenoid 108 when the first power supply 110 is expected to exhibit a rising zero crossing, for example.

In particular embodiments, the control module 106 may make a determination that a voltage (or current) amplitude of the first power supply 110 or the second power supply 112 (e.g., whichever power supply is currently connected to the switch 120) exceeds a threshold. In this context, the control module 106 controlling the power modulation circuit 104 may involve controlling the power modulation circuit 104 in response to making the determination. That is, the control module 106 may first determine that the voltage or current provided by the power supply is sufficient to operate the transfer switch 102 before attempting to operate the transfer switch 102.

In some embodiments, the control module 106 monitors the state of the transfer switch 102 (e.g., the switching mechanism 128) to see if the transfer switch 102 operates as expected. As such, the control module 106 may make a determination that, after a predetermined duration passes after causing the second power supply 112 (or the first power supply 110) to provide the current 114 through the solenoid 108, the transfer switch 102 has not created the conductive path between the load 116 and the second power supply 112 (or the first power supply 110). In this context, the control module 106 may control the power modulation circuit 104 to cause the second power supply 112 (or the first power supply 110) to stop providing the current 114 through the solenoid 108 in response to the determination (e.g., to prevent damage to the transfer switch 102).

The description of the different advantageous arrangements has been presented for purposes of illustration and description, and is not intended to be exhaustive or limited to the embodiments in the form disclosed. Many modifications and variations will be apparent to those of ordinary skill in the art. Further, different advantageous embodiments may describe different advantages as compared to other advantageous embodiments. The embodiment or embodiments selected are chosen and described in order to explain the principles of the embodiments, the practical application, and to enable others of ordinary skill in the art to understand the disclosure for various embodiments with various modifications as are suited to the particular use contemplated.

What is claimed is:

1. A system for controlling a transfer switch, the system comprising:
- a power modulation circuit; and
- a control module that, when the power modulation circuit is coupled to (1) a solenoid of a transfer switch, (2) a first power supply, and (3) a second power supply, is configured to perform functions comprising:
  - sensing one or more operating conditions of the system;
  - using the one or more operating conditions of the system as a basis to determine one or more control parameters; and
  - controlling, according to the one or more control parameters, the power modulation circuit to cause the second power supply to provide a current through the solenoid, thereby operating the transfer switch to discontinue a conductive path between a load and the first power supply and create a conductive path between the load and the second power supply.

2. The system of claim 1, wherein the power modulation circuit comprises a switch assembly having a first state and a second state,
- wherein in the first state the switch assembly is configured to provide a conductive path between the first power supply and the power modulation circuit, and
- wherein in the second state the switch assembly is configured to provide a conductive path between the second power supply and the power modulation circuit.

3. The system of claim 1, wherein the power modulation circuit comprises a switch configured to perform functions comprising:

receiving a control signal from the control module; and using the control signal as a basis to either create or discontinue a conductive path between (a) the solenoid and (b) the first power supply or the second power supply.

4. The system of claim 1, wherein the power modulation circuit comprises a rectifier configured to perform functions comprising:

rectifying alternating current received from the first power supply or the second power supply; and providing the rectified current to the solenoid.

5. The system of claim 1, wherein the one or more operating conditions of the system comprise one or more of a temperature associated with the system, a voltage or current amplitude of the first power supply, a voltage or current phase of the first power supply, a voltage or current amplitude of the second power supply, a voltage or current phase of the second power supply, or an amplitude of current passing through the solenoid.

6. The system of claim 1, wherein the one or more control parameters comprise a duty cycle, and wherein controlling the power modulation circuit comprises providing a control signal having the duty cycle to the power modulation circuit.

7. The system of claim 1, wherein the functions further comprise:

making a determination that a voltage or current amplitude of the first power supply or the second power supply exceeds a threshold, wherein controlling the power modulation circuit comprises controlling the power modulation circuit in response to making the determination.

8. The system of claim 1, wherein controlling the power modulation circuit comprises controlling the power modulation circuit such that a duration at least as long as a period of oscillation of the second power supply elapses between (a) the transfer switch discontinuing the conductive path between the load and the first power supply and (b) creating the conductive path between the load and the second power supply.

9. The system of claim 1, wherein controlling the power modulation circuit comprises controlling the power modulation circuit to cause the second power supply to begin providing current through the solenoid when a voltage or current phase of the second power supply is within a predetermined range of phase.

10. The system of claim 1, wherein the functions further comprise:

making a determination that, after a predetermined duration passes after causing the second power supply to provide the current through the solenoid, the transfer switch has not created the conductive path between the load and the second power supply, wherein controlling the power modulation circuit comprises controlling the power modulation circuit to cause the second power supply to stop providing the current through the solenoid in response to the determination.

11. A method for controlling a transfer switch, the method comprising:

sensing one or more operating conditions of a system that includes a power modulation circuit and a control module, wherein the power modulation circuit is coupled to a solenoid of a transfer switch, a first power supply, and a second power supply;

using the one or more operating conditions of the system as a basis to determine one or more control parameters; and controlling, according to the one or more control parameters, the power modulation circuit to cause the second power supply to provide a current through the solenoid, thereby operating the transfer switch to discontinue a conductive path between a load and the first power supply and create a conductive path between the load and the second power supply.

12. The method of claim 11, wherein controlling the power modulation circuit comprises:

providing, by the control module, a control signal to the power modulation circuit; and using, by the power modulation circuit, the control signal as a basis to either create or discontinue a conductive path between (a) the solenoid and (b) the first power supply or the second power supply.

13. The method of claim 11, wherein controlling the power modulation circuit comprises:

rectifying, by the power modulation circuit, alternating current received from the first power supply or the second power supply; and providing the rectified current to the solenoid.

14. The method of claim 11, wherein the one or more operating conditions of the system comprise one or more of a temperature associated with the system, a voltage or current amplitude of the first power supply, a voltage or current phase of the first power supply, a voltage or current amplitude of the second power supply, a voltage or current phase of the second power supply, or an amplitude of current passing through the solenoid.

15. The method of claim 11, wherein the one or more control parameters comprise a duty cycle, and wherein controlling the power modulation circuit comprises providing a control signal having the duty cycle to the power modulation circuit.

16. The method of claim 11, further comprising:

making a determination that a voltage or current amplitude of the first power supply or the second power supply exceeds a threshold, wherein controlling the power modulation circuit comprises controlling the power modulation circuit in response to making the determination.

17. The method of claim 11, wherein controlling the power modulation circuit comprises controlling the power modulation circuit such that a duration at least as long as a period of oscillation of the second power supply elapses between (a) the transfer switch discontinuing the conductive path between the load and the first power supply and (b) creating the conductive path between the load and the second power supply.

18. The method of claim 11, wherein controlling the power modulation circuit comprises controlling the power modulation circuit to cause the second power supply to begin providing current through the solenoid when a voltage or current phase of the second power supply is within a predetermined range of phase.

19. The method of claim 11, further comprising:

making a determination that, after a predetermined duration passes after causing the second power supply to provide the current through the solenoid, the transfer switch has not created the conductive path between the load and the second power supply, wherein controlling the power modulation circuit comprises controlling the power modulation circuit to cause the second power supply to stop providing the current through the solenoid in response to the determination.

20. A system for controlling a transfer switch, the system comprising:

a control module; and a power modulation circuit comprising:

a switch assembly having a first state and a second state, wherein in the first state the switch assembly is configured to provide a conductive path between a first power supply and the power modulation circuit, and wherein in the second state the switch assembly is configured to provide a conductive path between a second power supply and the power modulation circuit;

a switch configured to perform functions comprising:

receiving a control signal from the control module; and using the control signal as a basis to either create or discontinue a conductive path between (a) a solenoid of a transfer switch and (b) the first power supply or the second power supply; and a rectifier configured to perform functions comprising:

rectifying alternating current received from the first power supply or the second power supply; and providing the rectified current to the solenoid, wherein the control module is configured to perform functions comprising:

sensing one or more operating conditions of the system comprising one or more of a temperature associated with the system, a voltage or current amplitude of the first power supply, a voltage or current phase of the first power supply, a voltage or current amplitude of the second power supply, a voltage or current phase of the second power supply, or an amplitude of current passing through the solenoid;

using the one or more operating conditions of the system as a basis to determine a duty cycle; and providing a control signal having the duty cycle to the power modulation circuit to cause the second power supply to provide a current through the solenoid, thereby operating the transfer switch to discontinue a conductive path between a load and the first power supply and create a conductive path between the load and the second power supply.

* * * * *